(12) United States Patent
Bailey et al.

(10) Patent No.: US 8,193,961 B2
(45) Date of Patent: Jun. 5, 2012

(54) SYSTEMS AND METHODS FOR ENHANCING ANALOG TO DIGITAL CONVERSION RESOLUTION

(75) Inventors: James A. Bailey, Snowflake, AZ (US); Bruce McNeill, Yokohama (JP)

(73) Assignee: LSI Corporation, Milpitas, CA (US)

( * ) Notice: Subject to any disclaimer, the term of this patent is extended or adjusted under 35 U.S.C. 154(b) by 79 days.

(21) Appl. No.: 12/889,276

(22) Filed: Sep. 23, 2010

(65) Prior Publication Data
US 2012/0075131 A1  Mar. 29, 2012

(51) Int. Cl.
H03M 1/12 (2006.01)
(52) U.S. Cl. .......................... 341/155; 341/120; 341/139
(58) Field of Classification Search .................. 341/118, 341/120, 139, 155
See application file for complete search history.

(56) References Cited

U.S. PATENT DOCUMENTS

| | | |
|---|---|---|
| 4,672,518 A | 6/1987 | Murdock |
| 4,686,617 A | 8/1987 | Colton |
| 4,837,495 A | 6/1989 | Zansky |
| 4,885,674 A | 12/1989 | Varga et al. |
| 4,918,450 A | 4/1990 | Sugiyama et al. |
| 5,072,221 A | 12/1991 | Schmidt |
| 5,173,698 A | 12/1992 | Gulczynski |
| 5,182,477 A | 1/1993 | Yamasaki et al. |
| 5,225,837 A | 7/1993 | Hosotani et al. |
| 5,272,701 A | 12/1993 | Tsuruoka |
| 5,296,856 A | 3/1994 | Mantong |
| 5,418,493 A | 5/1995 | Dijkmans |
| 5,510,745 A | 4/1996 | Hamano et al. |
| 5,689,178 A | 11/1997 | Otake |
| 5,734,297 A | 3/1998 | Huijsing et al. |
| 5,789,973 A | 8/1998 | Barrett et al. |
| 5,801,564 A | 9/1998 | Gasparik |
| 5,809,060 A | 9/1998 | Cafarella et al. |
| 5,861,829 A | 1/1999 | Sutardja |
| 5,874,911 A | 2/1999 | Kodama |
| 5,929,705 A | 7/1999 | Zhang et al. |
| 5,936,466 A | 8/1999 | Andoh et al. |
| 6,002,356 A | 12/1999 | Cooper |
| 6,011,502 A | 1/2000 | Kao |
| 6,081,219 A | 6/2000 | Prasanna |
| 6,111,467 A | 8/2000 | Luo |
| 6,181,269 B1 | 1/2001 | Nishiuchi et al. |
| 6,225,859 B1 | 5/2001 | Irvine et al. |

(Continued)

OTHER PUBLICATIONS

U.S. Appl. No. 12/024,893, filed Feb. 1, 2008, Bailey.

(Continued)

*Primary Examiner* — Howard Williams
(74) *Attorney, Agent, or Firm* — Hamilton DeSanctis & Cha

(57) ABSTRACT

Various embodiments of the present invention provide systems and methods for analog to digital conversion. As an example, a circuit for converting analog signals to digital signals is disclosed. The circuit includes a variable gain amplifier circuit, an analog to digital converter circuit, and a summation circuit. The variable gain amplifier circuit is operable to apply a first gain value to an input to yield a first amplified output, and to apply a second gain value to the input to yield a second amplified output. The analog to digital converter circuit is operable to receive a derivative of the first amplified output and to provide a corresponding first digital sample, and to receive a derivative of the second amplified output and to provide a corresponding second digital sample. The summation circuit is operable to combine the first digital sample and the second digital sample.

21 Claims, 4 Drawing Sheets

U.S. PATENT DOCUMENTS

| | | | |
|---|---|---|---|
| 6,232,908 B1 | 5/2001 | Nakaigawa | |
| 6,369,743 B2 | 4/2002 | Ono | |
| 6,373,423 B1 | 4/2002 | Knudson | |
| 6,404,372 B1 | 6/2002 | Heithoff | |
| 6,404,374 B1 | 6/2002 | Yu et al. | |
| 6,556,081 B2 | 4/2003 | Muza | |
| 6,556,158 B2 | 4/2003 | Steensgaard-Madsen | |
| 6,563,445 B1 | 5/2003 | Sabouri | |
| 6,580,382 B2 | 6/2003 | Yung | |
| 6,600,373 B1 | 7/2003 | Bailey et al. | |
| 6,605,993 B2 | 8/2003 | Suzuki | |
| 6,653,966 B1 | 11/2003 | Van der Goes et al. | |
| 6,717,945 B1 | 4/2004 | Jue et al. | |
| 6,744,432 B1 | 6/2004 | Morein | |
| 6,756,841 B2 | 6/2004 | Jaussi et al. | |
| 6,784,824 B1 | 8/2004 | Quinn | |
| 6,816,101 B2 | 11/2004 | Hietala et al. | |
| 6,922,083 B2 | 7/2005 | Tanaka et al. | |
| 6,956,519 B1 | 10/2005 | Huang et al. | |
| 7,002,504 B2 | 2/2006 | McMahill | |
| 7,019,507 B1 | 3/2006 | Dittmer et al. | |
| 7,116,260 B2 | 10/2006 | Luh | |
| 7,129,874 B2 | 10/2006 | Bjornsen | |
| 7,190,298 B2 | 3/2007 | Mulder | |
| 7,209,068 B1 | 4/2007 | Chen et al. | |
| 7,233,277 B2 | 6/2007 | Roh | |
| 7,262,724 B2 | 8/2007 | Hughes et al. | |
| 7,333,580 B2 | 2/2008 | Parhi | |
| 7,362,153 B2 | 4/2008 | Sumesaglam | |
| 7,471,228 B2 | 12/2008 | Cho et al. | |
| 7,482,844 B2 | 1/2009 | Brady et al. | |
| 7,696,915 B2 | 4/2010 | Chmelar | |
| 7,706,434 B1 * | 4/2010 | Farjadrad et al. | 375/222 |
| 8,085,637 B2 * | 12/2011 | Hosokawa et al. | 369/53.35 |
| 2002/0186776 A1 | 12/2002 | Cosand | |
| 2005/0151588 A1 | 7/2005 | Bailey et al. | |
| 2006/0071709 A1 | 4/2006 | Maloberti | |
| 2006/0132242 A1 | 6/2006 | Han et al. | |
| 2007/0183006 A1 | 8/2007 | Lee | |
| 2008/0048896 A1 | 2/2008 | Parthasarthy et al. | |
| 2010/0176980 A1 * | 7/2010 | Breitschadel et al. | 341/155 |
| 2010/0208574 A1 * | 8/2010 | Ratnakar Aravind et al. | 369/134 |

OTHER PUBLICATIONS

U.S. Appl. No. 12/024,909, filed Feb. 1, 2008, Bailey.
U.S. Appl. No. 12/025,897, filed Nov. 20, 2007, Bailey et al.
U.S. Appl. No. 12/025,914, filed Nov. 20, 2007, Bailey et al.
U.S. Appl. No. 12/134,488, filed Jun. 6, 2008, Chmelar.
U.S. Appl. No. 12/134,501, filed Jun. 6, 2008, Chmelar.
U.S. Appl. No. 12/134,523, filed Jun. 6, 2008, Chmelar.
U.S. Appl. No. 12/669,481, filed Jan. 16, 2010, Chmelar.
U.S. Appl. No. 12/669,482, filed Jan. 16, 2010, Chmelar.
Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Diato et al., "A 14-bit 20-MS/s Pipelined ADC With Digital Distortion Calibration," IEEE J. Solid-State Circuits, vol. 41, No. 11, pp. 2417-2423. Nov. 2006.
Gupta, et al., "A 1GS/s 11 b Time Interleaved ADC in 0.13um CMOS", ISSCC Dig. Tech. Papers, pp. 576-577, Feb. 2006.
Katsuria, S. et al., "Techniques for High-Speed Implementation of Nonlinear Cancellation", IEEE Joun. Communications, vol. 9, No. 5, Jun. 1991, pp. 711-717.
Kim et al., "A 10-b, 10MS/s CMOS A/D Converter", IEEE J. Solid State Circuits, vol. 32, No. 3, pp. 302-311, Mar. 1997.
Mangelsdorf, C.W., "A 400-MHz Input Flash Converter With Error Correction", IEEE Journal of Solid-State Circuits, pp. 184-191, Feb. 1990, vol. 25 Issue 1.
Mehr, et al., "A 55-mW, 10-bit, 40-Msample/s Nyquist-Rate CMOS ADC," IEEE J. Solid-State Circuits, vol. 35, No. 3, pp. 302-311, Mar. 2000.
Nagaraj et al., "A 250 mW 8-b, 52 Msamples/s Parallel-Pipelined A/D Converter with Reduced Number of Amplifiers", IEEE J. Solid State Circuits, vol. 32, pp. 312-320, Mar. '97.
Schinkel, Daniel et al. A double- Tail Latch-Type Voltage Sense Maplifier with 18ps Setup+Hold Time, Feb. 13, 2007, ISSCC 2007, Session 13, pp. 314-315 and 605 IEEE.
Schmid & Moschtz, "A Tunable, Video-Frequency, Low Power Single Amplifier Biquadratic Filter in CMOS", Circuits and Systems, 1999, ISCAS'99. IEEE Int. Sym. on vol. 2, May 2.
Sedra, Adel S. et al. "Optimum Configurations for Single-Amplifier Biquadratic Filters" Dec. 1980, IEEE Trans. on Cir. and Sys., vol. CAS-27, No. 12, pp. 1155-1163.
Singer et al., "A 14-bit 10-MHz Calibrations-Free CMOS Pipelined A/D Converter," in Symp. VLSI Circuits Dig. Tech Papers, Jun. 1996, pp. 38-39.
Shu et al., "A 10-15-bit 60-MS/s Floating-point ADC with Digital Gain and Offset Calibration" Institute of Electrical and Electonics Engineers, NY NY ETATS-UNIS (2009).

* cited by examiner

SYSTEMS AND METHODS FOR ENHANCING ANALOG TO DIGITAL CONVERSION RESOLUTION

BACKGROUND OF THE INVENTION

The present inventions are related to systems and methods for analog to digital conversion.

Various circuits have been developed that include high speed analog to digital conversion circuits. Such high speed analog to digital conversion circuits often do not offer sufficient resolution to support calibration activities of the circuit. In some cases, a higher resolution analog to digital conversion circuit is implemented to provide a level of resolution sufficient to support both a calibration process and a standard operating process. While such an approach enables support of both standard and calibration activities, it is often costly in terms of semiconductor area. Further, in some cases, the higher resolution analog to digital conversion circuit may not be optimal for the standard circuit operation. In such a case, a non-optimal circuit ends up being used for the standard circuit operation all to be able to support a calibration procedure. To avoid this, some circuits include a separate analog to digital conversion circuit designed to support calibration process apart from another analog to digital conversion circuit designed to support standard circuit operations. Such an approach while satisfying differing requirements is costly. Yet another approach includes adding a dither signal to the standard analog to digital conversion circuit and taking multiple measurements followed by filtering resulting analog to digital conversion samples. Such an approach requires additional circuitry and thereby cost to produce the dither signal.

Hence, for at least the aforementioned reasons, there exists a need in the art for advanced systems and methods for analog to digital conversion.

BRIEF SUMMARY OF THE INVENTION

The present inventions are related to systems and methods for analog to digital conversion.

Various embodiments of the present invention provide circuits for converting analog signals to digital signals. Such circuits include a variable gain amplifier circuit, an analog to digital converter circuit, and a summation circuit. The variable gain amplifier circuit is operable to apply a first gain value to an input to yield a first amplified output, and to apply a second gain value to the input to yield a second amplified output. The analog to digital converter circuit is operable to receive a derivative of the first amplified output and to provide a corresponding first digital sample, and to receive a derivative of the second amplified output and to provide a corresponding second digital sample. The summation circuit is operable to combine the first digital sample and the second digital sample. The derivative of the first amplified output may be the first amplified output itself or from an intervening circuit. For example, the derivative of the first amplified output may be provided by a filter circuit that filters the first amplified output. Similarly, the derivative of the second amplified output may be the second amplified output itself or from an intervening circuit. For example, the derivative of the second amplified output may be provided by a filter circuit that filters the second amplified output.

In some instances of the aforementioned embodiments, combining the first digital sample and the second digital sample reduces a quantization noise resulting from the analog to digital conversion circuit. In various embodiments of the present invention, the summation circuit provides an aggregated output, and the aggregated output exhibits a quantization noise that is less than a quantization noise of the first digital sample. It should be noted that in place of the summation circuit, a digital low pass filter may be used to attenuate the signal. In various instances of the aforementioned embodiments, a difference between the first gain and the second gain is at least one half of the least significant bit of the analog to digital converter circuit. In one or more cases, a quantization error (also referred to herein as quantization noise) included in the first digital sample is uncorrelated to a quantization noise in the second digital sample.

In one or more instances of the aforementioned embodiments, the circuits further include a controller circuit operable to switch the first gain to the second gain after the first digital sample is obtained from the analog to digital converter circuit. In some such instances, the summation circuit provides an aggregated output, and the controller circuit is further operable to increment the gain of the variable gain amplifier through gain values in addition to the first gain and the second gain such that the quantization noise exhibited by the aggregated output is less than twenty-five percent of the least significant bit of the analog to digital converter circuit. In various cases, the quantization noise exhibited by the aggregated output is less than ten percent of the least significant bit of the analog to digital converter circuit. In other cases, the quantization noise exhibited by the aggregated output is less than five percent of the least significant bit of the analog to digital converter circuit.

Other embodiments of the present invention provide methods for enhanced resolution analog to digital conversion. Such methods include receiving an input; providing a variable gain amplifier circuit operable to amplify the input by an amount corresponding to a gain input; providing an analog to digital converter circuit; applying a first gain value to the gain input to yield a first amplified output corresponding to the input; applying a second gain value to the gain input to yield a second amplified output corresponding to the input; performing an analog to digital conversion of a derivative of the first amplified output using the analog to digital converter circuit to yield a first digital sample; performing an analog to digital conversion of a derivative of the second amplified output using the analog to digital converter circuit to yield a second digital sample; and aggregating the first digital sample and the second digital sample to yield an aggregated output.

In some instances of the aforementioned embodiments, the methods further include filtering the first amplified output to yield a first filtered output, and filtering the second amplified output to yield a second filtered output. In such instances, the derivative of the first amplified output is the first filtered output, and the derivative of the second amplified output is the second filtered output. In other instances of the aforementioned embodiments, aggregating the first digital sample and the second digital sample reduces a quantization noise resulting from the analog to digital conversion circuit. In various instances of the aforementioned embodiments, the aggregated output exhibits a quantization noise that is less than a quantization noise of the first digital sample. In yet other instances of the aforementioned embodiments, a difference between the first gain value and the second gain value is at least one half of the least significant bit of the analog to digital converter circuit. In some cases, a quantization noise included in the first digital sample is uncorrelated to a quantization noise in the second digital sample. In particular instances of the aforementioned embodiments, the methods further include providing the aggregated output as a digital output when a test operation mode is selected; and providing the first digital sample and the second digital sample as the digital output when a standard operation mode is selected.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for analog to digital conversion.

Various embodiments of the present invention provide systems, circuits and methods for enhancing the resolution of a given analog to digital converter circuit. Such embodiments utilize a variable gain amplifier circuit that feeds an analog to digital converter circuit. The gain of the variable gain amplifier circuit is progressively adjusted for a given input value such that the quantization error associated with an analog to digital conversion performed by the analog to digital converter circuit is uncorrelated. The uncorrelated quantization error may be substantially eliminated through a summing or averaging process. By reducing the quantization error at the output of the analog to digital converter circuit, the resolution of the analog to digital conversion is effectively increased when compared to performance of a single analog to digital conversion using the analog to digital converter circuit. As just one of many advantages achievable through implementation of embodiments of the present invention, the resolution of a given analog to digital converter circuit may be enhanced without changing operational characteristics of the circuit used during standard data processing. In various cases, additional circuitry to support two modes is not required, while in other cases only de minimus additional circuitry is employed to support differing functions. Based upon the disclosure provided herein, one of ordinary skill in the art will recognize a variety of other advantages that may be achieved either in addition to the aforementioned advantage or in place of the aforementioned advantage.

Figure 1:
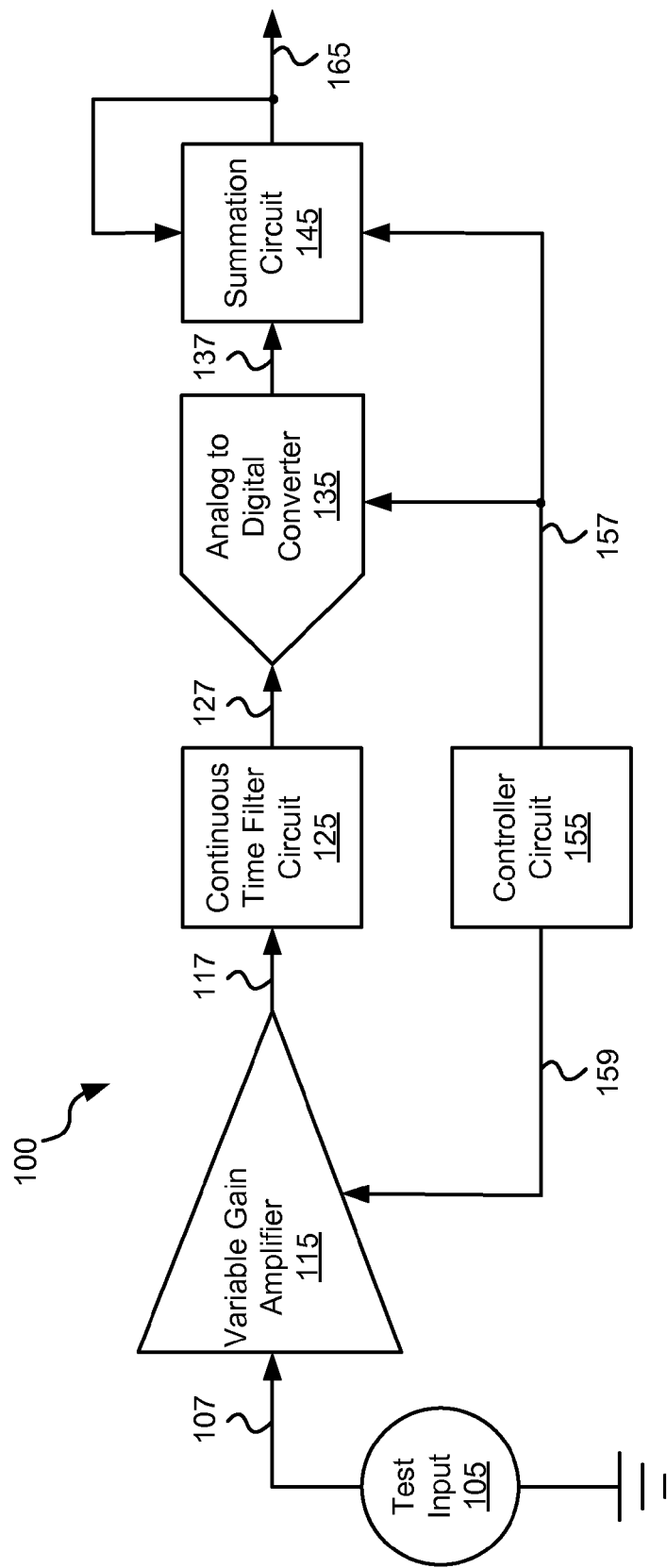
FIG. 1 depicts an enhanced resolution analog to digital converter circuit in accordance with various embodiments of the present invention.

Turning to FIG. 1, an enhanced resolution analog to digital converter circuit 100 is depicted in accordance with various embodiments of the present invention. Analog to digital converter circuit 100 includes a variable gain amplifier circuit 115 that amplifies a test input signal 107 by a gain provided as a gain control value 159. Variable gain amplifier circuit 115 may be any circuit known in the art that is capable of amplifying an input signal by a gain that may be selectably varied. Test input signal 107 is derived from a test input source 105. Test input source 105 may be any source capable of providing a voltage signal as test input signal 107. In some cases, test input signal is a DC voltage signal that may be converted from the analog signal domain to a digital sample value. In various cases, test input signal 107 is a series of discrete stepped DC voltage signals provided in steps from test input source 105, with each of the discrete DC voltage signals ultimately being provided as respective digital sample values. In other cases, test input 107 may be a sine or square wave signal. In such cases, the values being processed correspond to the magnitude calculation from a discrete Fourier transform of the input signal. Based upon the disclosure provided herein, one of ordinary skill in the art will recognize a variety of input signals that may be used in relation to different embodiments of the present invention.

The amplified test input signal 107 is provided as an amplified output 117 from variable gain amplifier circuit 115. Amplified output 117 is provided to a continuous time filter circuit 125. Continuous time filter circuit 125 may be any filter circuit known in the art that is capable of removing noise from amplified output 117 and/or performing anti-aliasing on amplified output 117. Continuous time filter 125 provides a filtered output 127 to an analog to digital converter circuit 135. Analog to digital converter circuit 135 may be any circuit known in the art that is capable of providing a digital value corresponding to a received analog input value. Based upon the disclosure provided herein, one of ordinary skill in the art will recognize a variety of analog to digital converter circuits that may be used in relation to different embodiments of the present invention.

Analog to digital converter circuit 135 provides one or more digital samples 137 each having a value that corresponds to filtered output 127. Digital samples 137 are provided to a summation circuit 145. Summation circuit 145 aggregates a number of instances of digital samples and provides the aggregate value as an aggregated output 165. Summation circuit 145 may be any circuit known in the art that is capable of accumulating a number of values into a single sum value. It should be noted that summation circuit 145 may be replaced by a digital low pass filter that attenuates a portion of an incoming signal.

A controller circuit 155 controls the stepping of gain control value 159 that is provided to variable gain amplifier circuit 115. In addition, controller circuit 155 provides control signals 157 to analog to digital converter circuit 135 and to summation circuit 145. Control signals 157 dictate the sampling rate of analog to digital converter circuit 135 where analog to digital converter circuit is a non-continuous circuit. In addition, control signals 157 provide for resetting the value of aggregated output 165 in preparation for processing another test input value. In some cases the reset signal is not used as summation circuit 145 is designed such that it is self resetting after a given number of samples have been processed.

In operation, the value provided by summation circuit 145 as aggregated value 165 is initially reset to zero by controller circuit 155. A selected test input signal 107 is applied to variable gain amplifier circuit 115. Controller circuit 155 initially sets gain control value 159 to a start value that controls the gain of variable gain amplifier circuit 115. Amplified output 117 corresponding to the selected test signal input 107 and default value of gain control value 159 is filtered using continuous time filter circuit 125 that provides a corresponding filtered output to analog to digital converter circuit 135. In turn, analog to digital converter circuit 135 provides a single digital sample 137 as synchronized by controller circuit 155 via control signals 157 corresponding to the selected test input signal 107 at the default gain applied by variable gain amplifier circuit 115. Digital sample 137 is added to the initial value (e.g., zero) held in summation circuit 145, and the result is provided as aggregated output 165.

Controller circuit 155 increments gain control value 159 for a subsequent sampling of the same test input signal 107. Amplified output 117 corresponding to the selected test signal input 107 and the newly selected value of gain control value 159 is filtered using continuous time filter circuit 125 that provides a corresponding filtered output to analog to digital converter circuit 135. In turn, analog to digital converter circuit 135 provides a single digital sample 137 as synchronized by controller circuit 155 via control signals 157 corresponding to the selected test input signal 107 at the newly selected gain applied by variable gain amplifier circuit 115. The generated digital sample 137 is added to the previously value held in summation circuit 145, and the result is provided as aggregated output 165.

The process of incrementing gain control value 159 and re-sampling the same test input signal 107 is repeated a number of times N. By incrementing gain control value 159 by an amount, $\Delta g$, that is greater than one half the least significant bit value of analog to digital converter circuit 135 (e.g., the resolution), the quantization noise (i.e., Vqn) from sample to sample is uncorrelated. As the number (i.e., N) of samples of the same test input signal 107 subjected to different gain values by variable gain amplifier circuit 115 increases, the overall quantization noise approaches zero. This reduction in quantization noise effectively increases the resolution of analog to digital converter circuit 135.

Aggregated output 165 is represented by the following equation:

$$\text{Aggregated Output } 165 = \sum_{k=\frac{-N}{2}}^{\frac{N}{2}} (\text{filtered Output } 127) * (G + k\Delta g) + Vqn_k,$$

where G is the starting or initial gain value applied to variable gain amplifier circuit 115 by controller circuit 155. The aforementioned equation can be reduced as follows:

$$\text{Aggregated Output } 165 = (N+1) * \text{filtered Output } 127 * G + \sum_{k=\frac{-N}{2}}^{\frac{N}{2}} Vqn_k.$$

Again, as the number of samples is increased, quantization noise value (i.e.

$$\left( \text{i.e., } \sum_{k=\frac{-N}{2}}^{\frac{N}{2}} Vqn_k \right)$$

approaches zero such that the value of aggregated output 165 can be estimated as:

Aggregated Output 165=(N+1)*filtered Output 127*G.

Thus, the resulting aggregate output derived from re-sampling the same test input signal yields a higher resolution analog to digital conversion output through reduction in the quantization noise.

It should be noted that the process described above can be repeated across many different value of test input signal 107 to yield a large set of test values at output 165 that can be used for testing and/or calibrating a circuit associated with enhanced resolution analog to digital converter circuit 100. In such a case, controller circuit 155 could be designed to increment a gain input (i.e., gain control value 159) across a range of gains as each different test input value is applied as test input signal 107. In some such cases, controller circuit 155 may be integrated into a test or calibration processing circuit implemented on a semiconductor device along with enhanced resolution analog to digital converter circuit 100. Based upon the disclosure provided herein, one of ordinary skill in the art will recognize other uses and advantages that may be achieved in accordance with different embodiments of the present invention.

Figure 2:
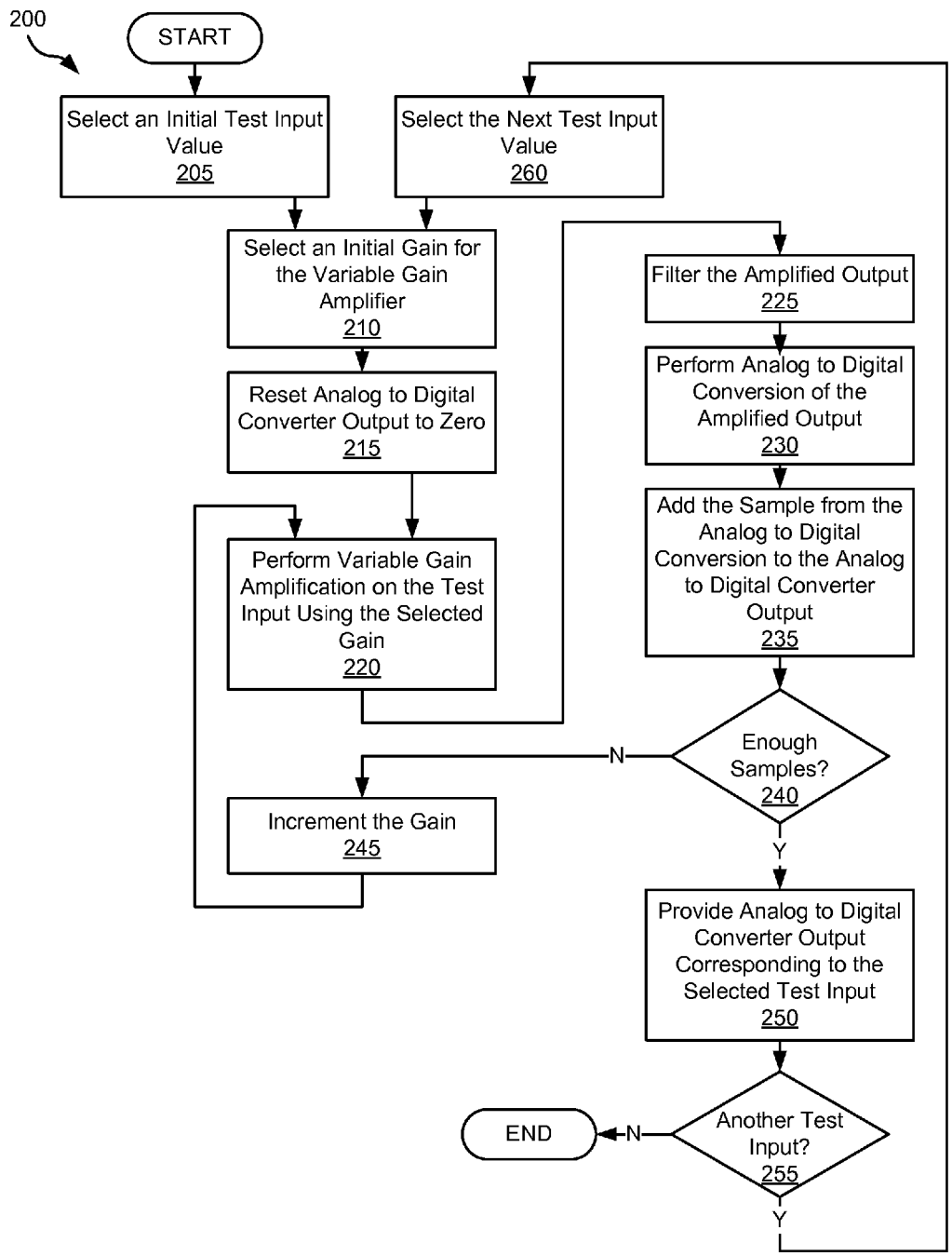
FIG. 2 is a flow diagram depicting a method in accordance with some embodiments of the present invention for enhancing the resolution of analog to digital conversion.

Turning to FIG. 2, a flow diagram 200 shows a method in accordance with some embodiments of the present invention for enhancing the resolution of analog to digital conversion. Following flow diagram 200, an initial test input value is selected (block 205). This may be done, for example, by applying a selected DC voltage to a test input or selecting one of a number of available DC voltages for application to a test input. In addition, an initial gain value for a variable gain amplifier is selected (block 210). The gain value provided to the variable gain amplifier controls the amount of amplification applied to a received input. An output of an analog to digital converter circuit is also initialized to zero (block 215).

A variable gain amplification is applied to the selected test input value (block 220), and the resulting amplified output is filtered (block 225). An analog to digital conversion of the filtered output is performed that generates a digital sample value corresponding to the selected test input (block 230). The generated digital sample value is added to an accumulated value of digital samples (block 235). Upon generating the first digital sample value, the accumulated value is equal to the generated sample value as the accumulated value was originally reset to zero. For subsequently generated digital sample values, the accumulated value is increased from a preceding value to the preceding value plus the value of the newly generated digital sample. The following equation represents the accumulated value of N samples:

$$\text{Accumulated Value} = \sum_{k=\frac{-N}{2}}^{\frac{N}{2}} (\text{filtered Output}) * (G + k\Delta g) + Vqn_k,$$

where G is the starting or initial gain value applied by the variable gain amplification, Δg is the change in the gain value applied at each incremental step of the process, and Vqn is the quantization noise.

It is determined whether enough samples have been taken (block 240). Where the value of Δg is selected to be greater than one half of the least significant bit of the analog to digital converter used, the quantization noise, Vqn, from sample to sample is uncorrelated. As such, accumulating the values of a number of samples causes the quantization noise to reduce and eventually approach zero. The number of samples to be taken (i.e., N) is selected based upon a desired level of quantization noise allowable after accumulation. As the level of quantization noise corresponds to the resolution of the analog to digital conversion process, it can be said another way that the number of samples that are used depends upon the desired resolution.

Where an insufficient number of samples have been accumulated (block 240), the gain value applied by the variable gain amplifier is incremented by Δg (block 245). Using this incremented gain value, the processes of blocks 220 through 240 are repeated.

Where a sufficient number of samples have been processed (block 240), the resulting accumulated value is provided as an output. Where a sufficient number of samples have been processed (i.e., via blocks 220-245), the value of the quantization noise, Vqn, approaches zero resulting the accumulated value being approximately:

$$\text{Accumulated Value} = (\text{filtered Output}) * (G + k\Delta g).$$

It is then determined whether another test input is to be processed (block 255). Where another test input is to be processed (block 255), the next test input value is selected (block 260). This newly selected test input value is processed as discussed above in relation to blocks 210 through 250. This process continues until an accumulated output has been generated for each test input.

Figure 3:
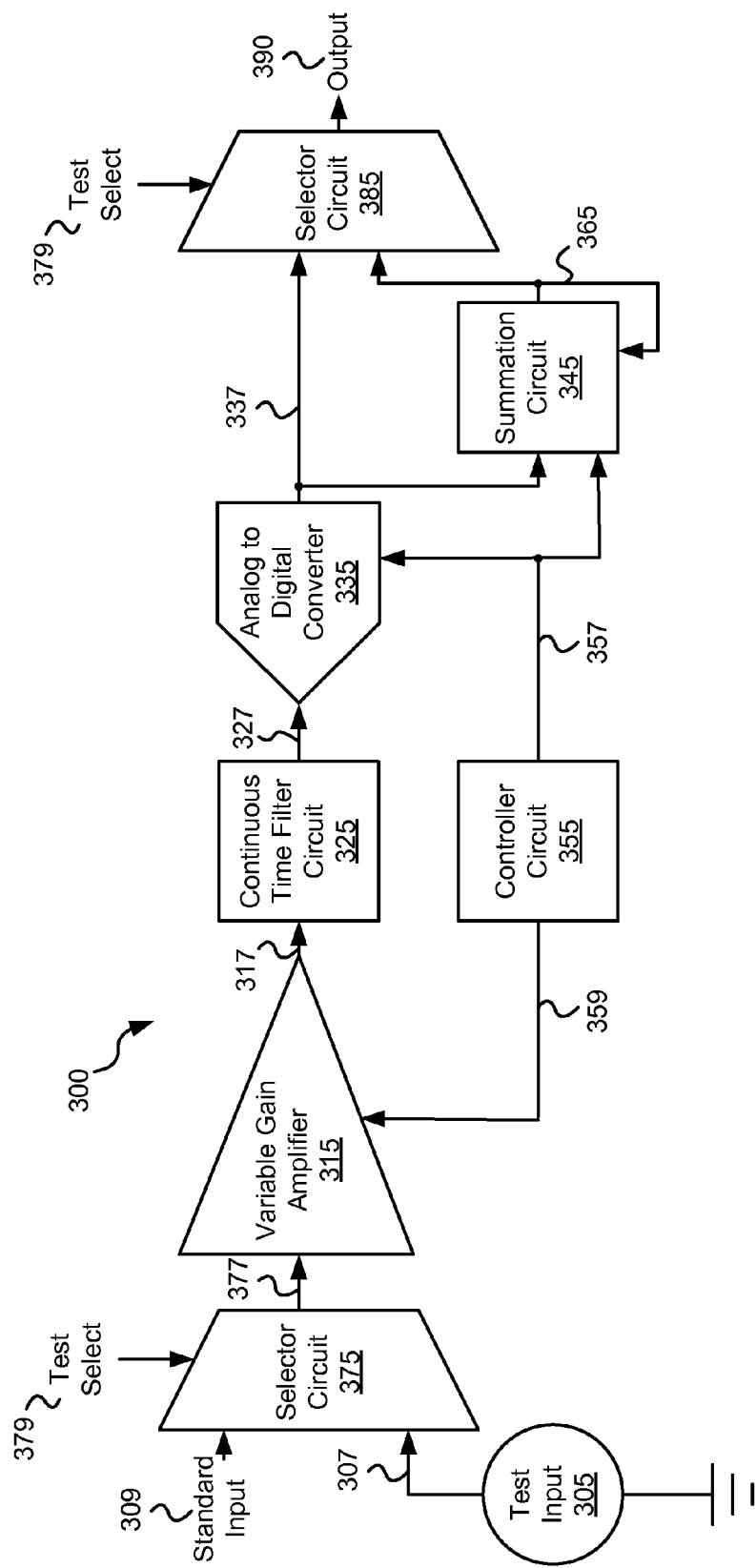
FIG. 3 depicts an enhanced resolution analog to digital converter circuit tailored for test calibration in accordance with various embodiments of the present invention.

Turning to FIG. 3, an enhanced resolution analog to digital converter circuit 300 is depicted that is tailored for test calibration in accordance with various embodiments of the present invention. Analog to digital converter circuit 300 includes a variable gain amplifier circuit 315 that amplifies an input signal 377 provided by a selector circuit 375. The amplification applied by variable gain amplifier circuit 315 is controlled by a gain control value 359. Variable gain amplifier circuit 315 may be any circuit known in the art that is capable of amplifying an input signal by a gain that may be selectably varied. The signal provided by selector circuit 375 as input signal 377 is based upon a test select input 379. Selector circuit 375 may be any circuit known in the art that is capable of receiving two or more input signals and providing a selected one of the input signals as an output. In one embodiment of the present invention, selector circuit 375 is a multiplexer circuit as are known in the art. In particular, when test select input 379 is asserted high, a standard input signal 309 is provided as input signal 377. Alternatively, when test select input 379 is asserted low, a test input signal 307 is provided as input signal 377.

Standard input signal 309 is a data signal that would normally be processed by a circuit in which enhanced resolution analog to digital converter circuit 300 is implemented. As an example, standard input signal 309 may be a data signal read from a storage medium via a read/write head assembly. As another example, standard input signal 309 may be a data signal received from a receiver of a wireless communication device. Based upon the disclosure provided herein, one of ordinary skill in the art will recognize a variety of other sources from which standard input signal 309 may be derived in accordance with different embodiments of the present invention.

In contrast, test input signal 307 is derived from a test input source 305. Test input source 305 may be any source capable of providing a voltage signal as test input signal 307. In some embodiments, test input signal is a DC voltage signal that may be converted from the analog signal domain to a digital sample value. In various cases, test input signal 307 is a series of discrete DC voltage signals provided in steps from test input source 305, with each of the discrete DC voltage signals ultimately being provided as respective digital sample values.

An amplified version of input signal 377 is provided as an amplified output 317 from variable gain amplifier circuit 315. Amplified output 317 is provided to a continuous time filter circuit 325. Continuous time filter circuit 325 may be any filter circuit known in the art that is capable of removing noise from amplified output 317 and/or performing anti-aliasing on amplified output 317. Continuous time filter 325 provides a filtered output 327 to an analog to digital converter circuit 335. Analog to digital converter circuit 335 may be any circuit known in the art that is capable of providing a digital value corresponding to a received analog input value. Based upon the disclosure provided herein, one of ordinary skill in the art will recognize a variety of analog to digital converter circuits that may be used in relation to different embodiments of the present invention.

Analog to digital converter circuit 335 provides one or more digital samples 337 each having a value that corresponds to filtered output 327. Digital samples 337 are provided to a summation circuit 345. Summation circuit 345 aggregates a number of instances of digital samples and provides the aggregate value as an aggregated output 365. Summation circuit 345 may be any circuit known in the art that is capable of accumulating a number of values into a single sum value.

A controller circuit 355 controls the stepping of gain control value 359 that is provided to variable gain amplifier circuit 315. In addition, controller circuit 355 provides control signals 357 to analog to digital converter circuit 335 and to summation circuit 345. Control signals 357 dictate the sampling rate of analog to digital converter circuit 335 where analog to digital converter circuit is a non-continuous circuit. In addition, control signals 357 provide for resetting the value of aggregated output 365 in preparation for processing another test input value. In some embodiments the reset signal is not used as summation circuit 345 is designed such that it is self resetting after a given number of samples have been processed.

In addition, digital samples 337 and aggregated output 365 are provided to a selector circuit 385. Selector circuit 385 may be any circuit known in the art that is capable of receiving two or more input signals and providing a selected one of the input signals as an output. In one embodiment of the present invention, selector circuit 385 is a multiplexer circuit as are known in the art. In particular, when test select input 379 is asserted high, digital samples 337 are provided as an output 390 from analog to digital converter circuit 300. This represents a non-test or standard circuit operation. Alternatively, when test select input 379 is asserted low, aggregated output 365 is provided as output 390. This represents a test or calibration operation.

In operation where a test operation is desired, test select input 379 is asserted high. In such a case, test input signal 307 is provided by selector circuit 375 as input signal 377 to variable gain amplifier circuit 315 and aggregated output 365 is provided by selector circuit 385 as output 390. In addition, the value provided by summation circuit 345 as aggregated value 365 is initially reset to zero by controller circuit 355. Controller circuit 355 initially sets gain control value 359 to a start value that controls the gain of variable gain amplifier circuit 315. Amplified output 317 corresponding to the selected test signal input 307 and default value of gain control value 359 is filtered using continuous time filter circuit 325 that provides a corresponding filtered output to analog to digital converter circuit 335. In turn, analog to digital converter circuit 335 provides a single digital sample 337 as synchronized by controller circuit 355 via control signals 357 corresponding to the selected test input signal 307 at the default gain applied by variable gain amplifier circuit 315. Digital sample 337 is added to the initial value (e.g., zero) held in summation circuit 345, and the result is provided as aggregated output 365.

Controller circuit 355 increments gain control value 359 for a subsequent sampling of the same test input signal 307. Amplified output 317 corresponding to the selected test signal input 307 and the newly selected value of gain control value 359 is filtered using continuous time filter circuit 325 that provides a corresponding filtered output to analog to digital converter circuit 335. In turn, analog to digital converter circuit 335 provides a single digital sample 337 as synchronized by controller circuit 355 via control signals 357 corresponding to the selected test input signal 307 at the newly selected gain applied by variable gain amplifier circuit 315. The generated digital sample 337 is added to the previously value held in summation circuit 345, and the result is provided as output 390.

It should be noted that the process described above can be repeated across many different value of test input signal 307 to yield a large set of test values at output 365 that can be used for testing and/or calibrating a circuit associated with enhanced resolution analog to digital converter circuit 300. In such a case, controller circuit 355 could be designed to increment a gain input (i.e., gain control value 359) across a range of gains as each different test input value is applied as test input signal 307. In some such cases, controller circuit 355 may be integrated into a test or calibration processing circuit implemented on a semiconductor device along with enhanced resolution analog to digital converter circuit 300. Based upon the disclosure provided herein, one of ordinary skill in the art will recognize other uses and advantages that may be achieved in accordance with different embodiments of the present invention.

In operation where a standard or non-test operation is desired, test select input 379 is asserted low. In such a case, standard input 309 is provided by selector circuit 375 as input signal 377 to variable gain amplifier circuit 315 and digital samples 337 are provided by selector circuit 385 as output 390. In this condition, each analog value provided as standard input 309 is converted from an analog signal to a digital signal (i.e., digital samples 337) and provided as output 390.

Figure 4:
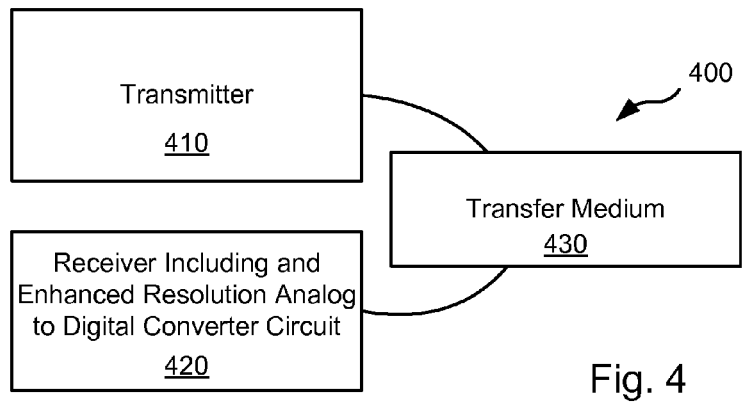
FIG. 4 depicts a communication system including an enhanced resolution analog to digital converter circuit in accordance with one or more embodiments of the present invention and FIG. 5 shows a storage system including a read channel circuit with an enhanced resolution analog to digital converter circuit in accordance with some embodiments of the present invention.

Turning to FIG. 4, a communication system 400 including a receiver 420 with an enhanced resolution analog to digital converter circuit in accordance with one or more embodiments of the present invention is shown. Communication system 400 includes a transmitter 410 that is operable to transmit encoded information via a transfer medium 430 as is known in the art. The encoded data is received from transfer medium 430 by receiver 420. Receiver 420 incorporates enhanced resolution analog to digital converter circuit. The incorporated enhanced resolution analog to digital converter circuit may be the enhanced resolution analog to digital converter circuit disclosed above in relation to FIG. 1, or the enhanced resolution analog to digital converter circuit disclosed above in relation to FIG. 3. In addition or alternative to the aforementioned enhanced resolution analog to digital converter circuit, a method of analog to digital conversion process may be done in accordance with that described above in relation to FIG. 2.

Figure 5:
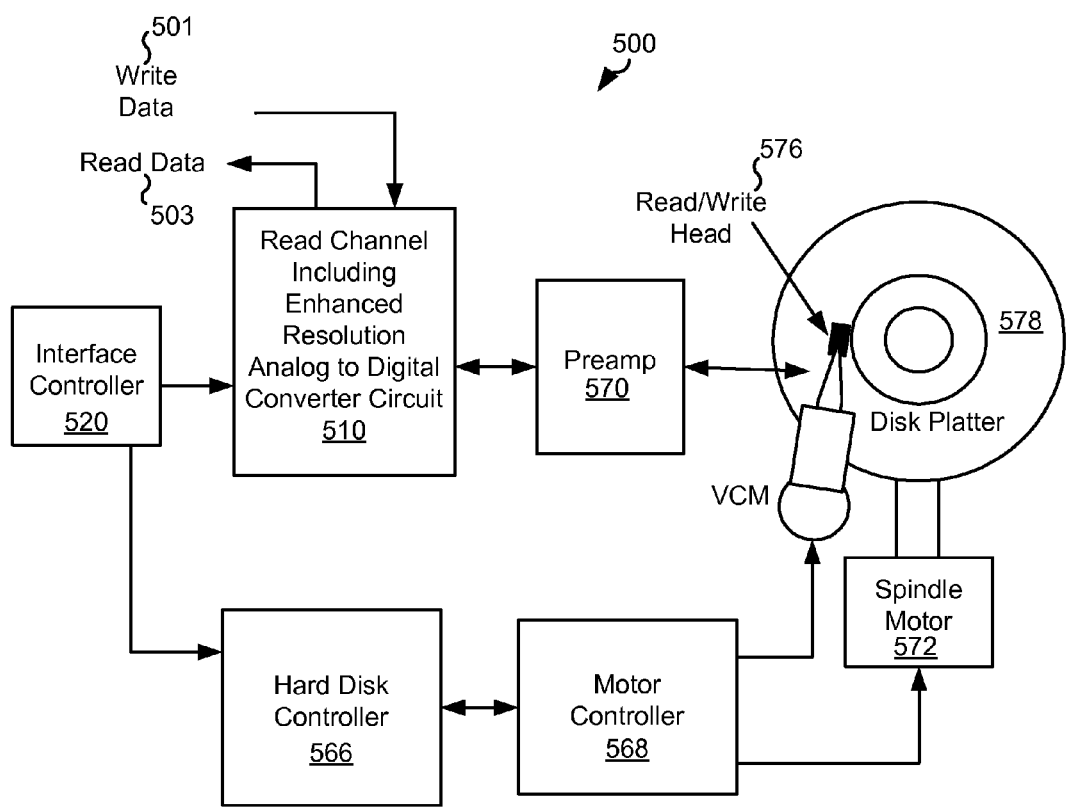

Turning to FIG. 5, a storage system 500 including a read channel circuit 510 with an enhanced resolution analog to digital converter circuit is shown in accordance with various embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 364 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 performs an analog to digital conversion process and/or various test processes. Such analog to digital conversion may be done using an enhanced resolution analog to digital converter circuit similar to that described above in relation to FIG. 1. Alternatively, the analog to digital conversion may be done using an enhanced resolution analog to digital converter circuit similar to that described above in relation to FIG. 3. In addition or alternative to the aforementioned enhanced resolution analog to digital converter circuit, a method of analog to digital conversion process may be done in accordance with that described above in relation to FIG. 2. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for analog to digital conversion. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A circuit for converting analog signals to digital signals, the circuit comprising:
   a variable gain amplifier circuit operable to apply a first gain value to an input to yield a first amplified output, and to apply a second gain value to the input to yield a second amplified output;
   an analog to digital converter circuit operable to receive a derivative of the first amplified output and to provide a corresponding first digital sample, and to receive a derivative of the second amplified output and to provide a corresponding second digital sample; and
   a summation circuit operable to combine the first digital sample and the second digital sample.

2. The circuit of claim 1, wherein combining the first digital sample and the second digital sample reduces a quantization noise resulting from the analog to digital conversion circuit.

3. The circuit of claim 1, wherein the summation circuit provides an aggregated output, and wherein the aggregated output exhibits a quantization noise that is less than a quantization noise of the first digital sample.

4. The circuit of claim 1, wherein the circuit further comprises:
   a controller circuit operable to switch the first gain to the second gain after the first digital sample is obtained from the analog to digital converter circuit.

5. The circuit of claim 4, wherein the summation circuit provides an aggregated output, and wherein the controller circuit is further operable to increment the gain of the variable gain amplifier through gain values in addition to the first gain and the second gain such that the quantization noise exhibited by the aggregated output is less than twenty-five percent of the least significant bit of the analog to digital converter circuit.

6. The circuit of claim 5, wherein the quantization noise exhibited by the aggregated output is less than ten percent of the least significant bit of the analog to digital converter circuit.

7. The circuit of claim 6, wherein the quantization noise exhibited by the aggregated output is less than five percent of the least significant bit of the analog to digital converter circuit.

8. The circuit of claim 1, wherein a difference between the first gain and the second gain is at least one half of the least significant bit of the analog to digital converter circuit.

9. The circuit of claim 1, wherein a quantization noise included in the first digital sample is uncorrelated to a quantization noise in the second digital sample.

10. The circuit of claim 1, wherein the circuit further comprises: a digital output value, wherein the first digital sample and the second digital sample are provided as the digital output value when a standard operation mode is selected, wherein the summation circuit provides an aggregated output, and wherein the aggregated output is provided as the digital output value when a test operation mode is selected.

11. The circuit of claim 1, wherein the input is selected as a test input when a test operation mode is selected, and wherein the input is selected as a standard input when a standard operation mode is selected.

12. The circuit of claim 1, wherein the circuit further comprises:
   an analog filter circuit operable to receive the amplified output and to provide a filtered, wherein the derivative of the first amplified output is the filtered output corresponding to the first amplified output, and wherein the derivative of the second amplified output is the filtered output corresponding to the second amplified output.

13. The circuit of claim 1, wherein the derivative of the first amplified output is the first amplified output, and wherein the second amplified output is the second amplified output.

14. The circuit of claim 1, wherein the circuit is implemented as part of an integrated circuit.

15. A method for enhanced resolution analog to digital conversion, the method comprising:
   receiving an input;
   providing a variable gain amplifier circuit operable to amplify the input by an amount corresponding to a gain input;
   providing an analog to digital converter circuit;
   applying a first gain value to the gain input to yield a first amplified output corresponding to the input;
   applying a second gain value to the gain input to yield a second amplified output corresponding to the input;
   performing an analog to digital conversion of a derivative of the first amplified output using the analog to digital converter circuit to yield a first digital sample;
   performing an analog to digital conversion of a derivative of the second amplified output using the analog to digital converter circuit to yield a second digital sample; and
   aggregating the first digital sample and the second digital sample to yield an aggregated output.

16. The method of claim 15, wherein the method further comprises:
   filtering the first amplified output to yield a first filtered output, wherein the derivative of the first amplified output is the first filtered output; and
   filtering the second amplified output to yield a second filtered output, wherein the derivative of the second amplified output is the second filtered output.

17. The method of claim 15, wherein aggregating the first digital sample and the second digital sample reduces a quantization noise resulting from the analog to digital conversion circuit.

18. The method of claim 15, wherein the aggregated output exhibits a quantization noise that is less than a quantization noise of the first digital sample.

19. The method of claim 15, wherein a difference between the first gain value and the second gain value is at least one half of the least significant bit of the analog to digital converter circuit.

20. The method of claim 15, wherein a quantization noise included in the first digital sample is uncorrelated to a quantization noise in the second digital sample.

21. The method of claim 15, wherein the method further comprises:
 providing the aggregated output as a digital output when a test operation mode is selected; and
 providing the first digital sample and the second digital sample as the digital output when a standard operation mode is selected.

* * * * *